US007595713B2

(12) United States Patent
Yu et al.

(10) Patent No.: US 7,595,713 B2
(45) Date of Patent: Sep. 29, 2009

(54) MAGNETIC FIELD GENERATOR FOR MRI AND METHOD OF COVERING MAGNETIC FIELD GENERATOR FOR MRI

(75) Inventors: Hai Yu, Wuxi (CN); Misao Baba, Tokyo (JP); William E-Wei Chen, Wuxi (CN); Shaohui Shi, Wuxi (CN); Ke Chen, Wuxi (CN)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 604 days.

(21) Appl. No.: 10/552,359

(22) PCT Filed: Apr. 4, 2003

(86) PCT No.: PCT/CN03/00244

§ 371 (c)(1),
(2), (4) Date: Oct. 3, 2005

(87) PCT Pub. No.: WO2004/088344

PCT Pub. Date: Oct. 14, 2004

(65) Prior Publication Data

US 2006/0181276 A1 Aug. 17, 2006

(51) Int. Cl.
*G01R 33/20* (2006.01)
*G01V 3/00* (2006.01)

(52) U.S. Cl. ........................ 335/296; 335/301; 324/318

(58) Field of Classification Search ......... 335/296–306; 324/318–320
See application file for complete search history.

(56) References Cited

U.S. PATENT DOCUMENTS

| | | | |
|---|---|---|---|
| 1,973,932 A * | 9/1934 | Sharp et al. | 217/43 R |
| 4,564,812 A | 1/1986 | Van Dijk | |
| 4,673,166 A | 6/1987 | MacDougall | |
| 6,313,632 B1 | 11/2001 | Aoki et al. | |

FOREIGN PATENT DOCUMENTS

| | | |
|---|---|---|
| JP | 62185981 | 8/1987 |
| JP | 08151076 | 11/1996 |
| JP | 10001285 | 1/1998 |
| JP | 11148781 | 6/1999 |
| JP | 2000005143 | 1/2000 |

OTHER PUBLICATIONS

Japanese Utility Model Application, JP3-35071, Packing Cover for Furniture, Etc., Inventor(s)/Owner: Morikazu, Noguchi, Publication Date: Apr. 5, 1991.

Japanese Utility Model Application, JP3086506, Hanging Metal Fitting for Rectangular Wire Cylinder, Inventor(s)/Owner: Bunzo Shibuya, Publication Date: Mar. 27, 2002.

* cited by examiner

*Primary Examiner*—Ramon M Barrera
(74) *Attorney, Agent, or Firm*—Armstrong Teasdale LLP

(57) ABSTRACT

A magnetic field generator for MRI comprises a generator main body and a covering member for covering the whole generator main body, and the covering member is made of a non-magnetic material, for example a closely woven fabric of stainless steel, aluminum, copper, nylon, cotton, hemp, flax, rubber or plastics, and a fastening member is provided for fastening the covering member to the generator main body, which is formed of a string or a rope made of stainless steel, aluminum, copper, nylon, cotton, hemp, flax, rubber or plastics.

20 Claims, 8 Drawing Sheets

100

10
10t
1c
10h
1
10s
10m
10b
1a
1b

MAGNETIC FIELD GENERATOR FOR MRI AND METHOD OF COVERING MAGNETIC FIELD GENERATOR FOR MRI

TECHNICAL FIELD OF THE INVENTION

The present invention relates to a magnetic field generator for MRI and a method of covering a magnetic field generator for MRI, and more particularly, to a magnetic field generator for MRI and a method of covering a magnetic field generator for MRI, capable of reducing the time and labors needed for packing or covering to store or transport the magnetic field generator for MRI.

BACKGROUND OF THE INVENTION

A magnetic field generator using a permanent magnet has very strong magnetism. During storage or transport of the magnetic field generator, a magnetic object, such as rigs, wrench, jack and hammer, would be drawn inside the magnetic field generator, and thereby, the generator would be damaged. Even though the generator is not damaged, if the magnetic object is drawn and left inside the generator, there is a possibility that uniformity of a magnetic field generated by the generator in magnetic resonance imaging (MRI) would become impaired. Accordingly, it is required to surely cover or pack the magnetic field generator.

As a conventional example, U.S. Pat. No. 6,313,632 B1 discloses a method for packing a magnetic field generator for FRI. However, in U.S. Pat. No. 6,313,632 B1, there is a problem that a lot of time and labors are needed for the packing, since many shielding members or packing members are attached to the magnetic field generator by using many studs and/or fixing members.

Therefore, the objective of the present invention is to provide a magnetic field generator for MRI and a method of covering a magnetic field generator for MRI, capable of reducing the time and labors needed for packing or covering to store or transport the magnetic field generator for MRI while securely preventing the magnetic object from intruding into the magnetic field generator.

DISCLOSURE OF THE INVENTION

As the first aspect, the present invention provides a magnetic field generator for MRI comprising: a generator main body including a pair of plate yokes opposed to each other with space in between, a pair of magnets disposed in opposed parts of said pair of plate yokes, and a column yoke for magnetically connecting said plate yokes; and a member, made of a non-magnetic material, for covering the whole generator main body.

As the second aspect, the present invention provides a magnetic field generator for MRI comprising; a generator main body including a pair of plate yokes opposed to each other with space in between, a pair of magnets disposed in the opposed parts of the pair of plate yokes, and a column yoke for magnetically connecting the plate yokes; and a member, made of a non-magnetic material, for covering a top and a side of said generator main body or a side of said generator main body or a bottom and a side of said generator main body.

As the third aspect, the present invention provides the magnetic field generator according to the first or second aspects, said covering member is made of a mesh of stainless steel, aluminum, copper, nylon, cotton, hemp, flax, rubber or plastics.

As the fourth aspect, the present invention provides the magnetic field generator according to the first or second aspects, at least a portion of said covering member, which covers an opening portion of said generator main body, includes a mesh of stainless steel, aluminum, copper, nylon, cotton, hemp, flax, rubber or plastics.

As the fifth aspect, the present invention provides the magnetic field generator according to the first or second aspects, said covering member is made of a closely woven fabric of stainless steel, aluminum, copper, nylon, cotton, hemp, flax, rubber or plastics.

As the sixth aspect, the present invention provides the magnetic field generator according to the fifth aspect, at least a portion of said covering member, which covers an opening portion of said generator main body, includes a mesh of stainless steel, aluminum, copper, nylon, cotton, hemp, flax, rubber or plastics.

As the seventh aspect, the present invention provides the magnetic field generator according to the first or second aspects, at least a portion of said covering member, which covers an opening portion of said generator main body, includes a mesh of stainless steel, aluminum, copper, nylon, cotton, hemp, flax, rubber or plastics, and other portion of said covering member is made of a closely woven fabric of stainless steel, aluminum, copper, nylon, cotton, hemp, flax, rubber or plastics.

As the eighth aspect, the present invention provides the magnetic field generator according to any one of the first to the seventh aspects, further comprising a member for fastening said covering member to said generator main body.

As the ninth aspect, the present invention provides the magnetic field generator according to the eighth aspect, said fastening member includes a string or a rope made of stainless steel, aluminum, copper, nylon, cotton, hemp, flax, rubber or plastics.

As the tenth aspect, the present invention provides the magnetic field generator according to the eighth or ninth aspects, said fastening member is provided on one side of said pair of plate yokes.

As the eleventh aspect, the present invention provides the magnetic field generator according to the eighth or ninth aspects, said fastening member is provided so as to pass around said covering member.

As the twelfth aspect, the present invention provides the magnetic field generator according to any one of the eighth to eleventh aspects, said fastening member is removable after said magnetic field generator is transported to a destination thereof.

As the thirteenth aspect, the present invention provides the magnetic field generator according to the first or second aspects, said covering member is removable after said magnetic field generator is transported to a destination thereof.

As the fourteenth aspect, the present invention provides a method of covering a magnetic field generator for MRI, having a generator main body including a pair of plate yokes opposed to each other with space in between, a pair of magnets disposed in opposed parts of said pair of plate yokes, and a column yoke for magnetically connecting said plate yokes, comprising steps of: covering the whole generator main body by means of a member made of a non-magnetic material; and fastening said member to said generator main body.

As the fifteenth aspect, the present invention provides a method of covering a magnetic field generator for MRI, having a generator main body including a pair of plate yokes opposed to each other with space in between, a pair of magnets disposed in opposed parts of said pair of plate yokes, and a column yoke for magnetically connecting said plate yokes, comprising steps of: covering a top and a side of said generator main body or a side of said generator main body or a bottom and a side of said generator main body by means of a member made of a non-magnetic material; and fastening said member to said generator main body.

As the sixteenth aspect, the present invention provides the method according to the fourteenth or fifteenth aspects, at least a portion of said member, which covers an opening portion of said generator main body, includes a mesh of stainless steel, aluminum, copper, nylon, cotton, hemp, flax, rubber or plastics.

As the seventeenth aspect, the present invention provides the method according to the fourteenth or fifteenth aspects, said member is made of a closely woven fabric of stainless steel, aluminum, copper, nylon, cotton, hemp, flax, rubber or plastics.

As the eighteenth aspect, the present invention provides the method according to the fourteenth or fifteenth aspects, at least a portion of said member, which covers an opening portion of said generator main body, includes a mesh of stainless steel, aluminum, copper, nylon, cotton, hemp, flax, rubber or plastics, and other portion of said covering member is made of a closely woven fabric of stainless steel, aluminum, copper, nylon, cotton, hemp, flax, rubber or plastics.

As the nineteenth aspect, the present invention provides the method according to any one of the fourteenth to eighteenth aspects, said fastening step includes a step of fastening said member to said generator main body using a string or a rope made of stainless steel, aluminum, copper, nylon, cotton, hemp, flax, rubber or plastics.

As the twentieth aspect, the present invention provides the method according to the nineteenth aspect, said member for covering said generator main body and said string or rope are removable after said magnetic field generator is transported to a destination thereof.

According to the present invention, there is no any connection member, such as studs, between the magnetic field generator and the covering member, which would reduce the time and labors needed to pack or cover the magnetic field generator for MRI for the storage and transport thereof while securely preventing the magnetic object from intruding into the magnetic field generator.

BEST MODE TO IMPLEMENT THE INVENTION

The present invention will be described in more detail in conjunction with embodiments illustrated in their relevant drawings.

First Embodiment

Figure 1:
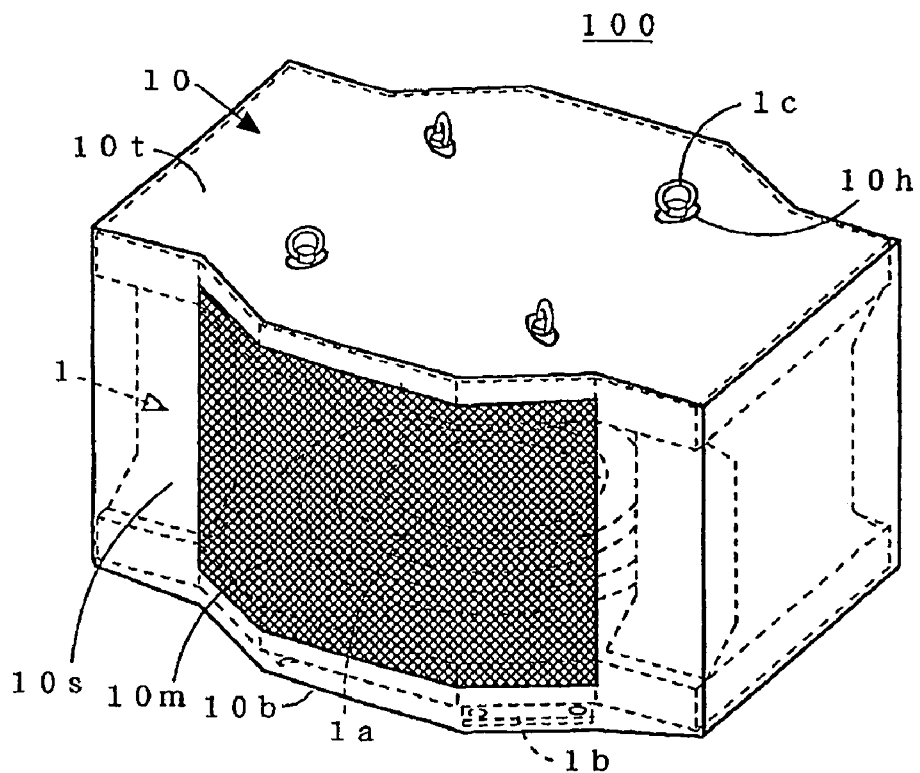
FIG. 1 is a perspective view of a magnetic field generator for MRI of a first embodiment of the present invention, which is covered by a covering member.

FIG. 1 is a perspective view of a magnetic field generator for MRI of a first embodiment of the present invention, which is covered by a covering member.

As shown in this figure, a magnetic field generator 100 for MRI includes a generator main body 1 and a covering member 10 for covering the whole generator main body 1.

The covering member 10 may be a large bag having a top part 10*t*, a side part 10*s* with a mesh portion 10*m*, and a bottom part 10*b*, and is formed so as to wholly cover the generator main body 1 from above. The mesh portion 10*m* covers an opening portion 1*a* of the generator main body 1 for enabling one to look in through the mesh portion 10*m* in order to see the generator main body 1 inside of the covering member 10. The top part 10*t*, the side part 10*s* except the mesh portion 10*m* and the bottom part 10*b* are made of a non-magnetic material, for example a closely woven fabric of stainless steel, aluminum, copper, nylon, cotton, hemp, flax, rubber or plastics. The mesh portion 10*m* is made of a non-magnetic material, for example a mesh or a net of stainless steel, aluminum, copper, nylon, cotton, hemp, flax, rubber or plastics. The materials of the top part lot, the side part 10*s* and the bottom part 10*b*, and the mesh portion 10*m* are not limited to the above materials, and any material can be adopted for them, which has strength such that a magnetic object, such as rigs, wrench, jack and hammer, can be prevented from intruding into the magnetic field generator 100 and an internal structure of the magnetic field generator 100 can be protected.

Figure 4:
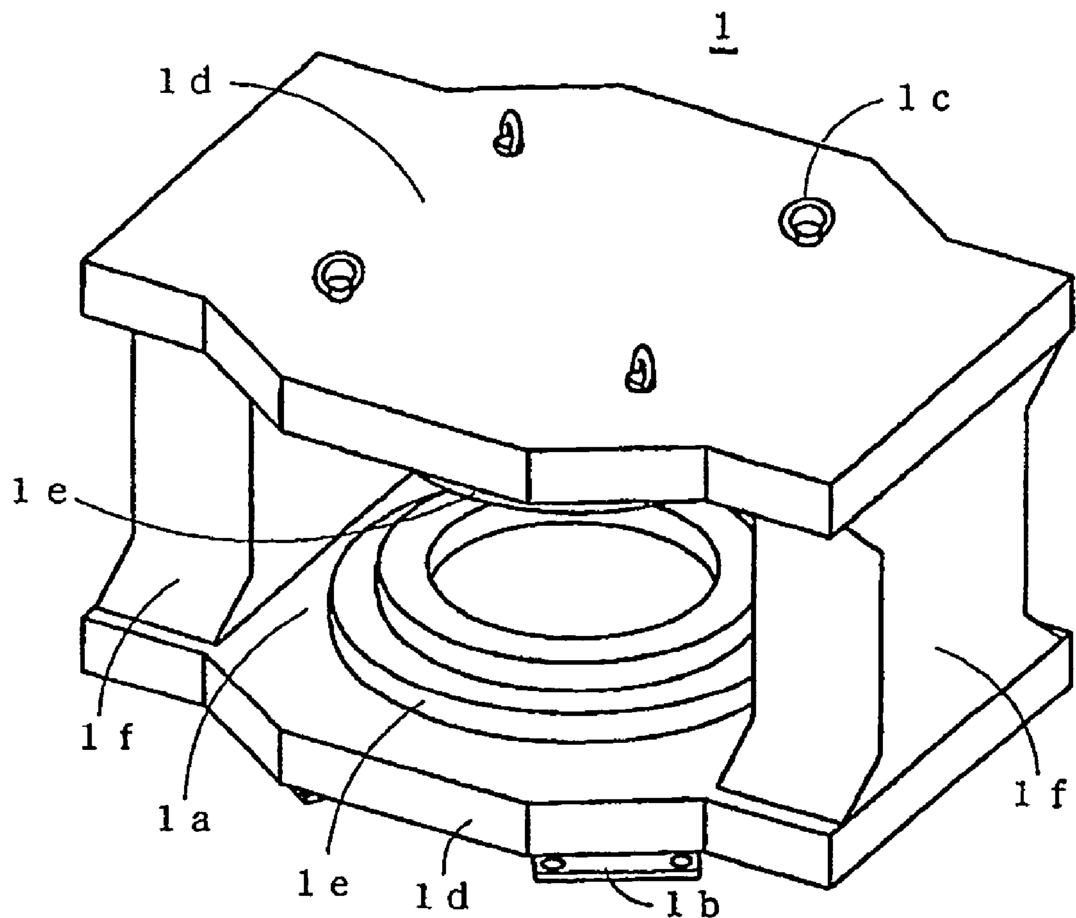
FIG. 4 is a perspective view of a generator main body.

The top part 10*t* has four holes 10*h* for exposing four rings 1*c* of the generator main body 1, which are provided in an upper plate yoke 1*d* shown in FIG. 4. These rings 1*c* are used to lift up the magnetic field generator 100 for MRI. A numeral 1*b* denotes a leg of the generator main body 1.

Figure 2:
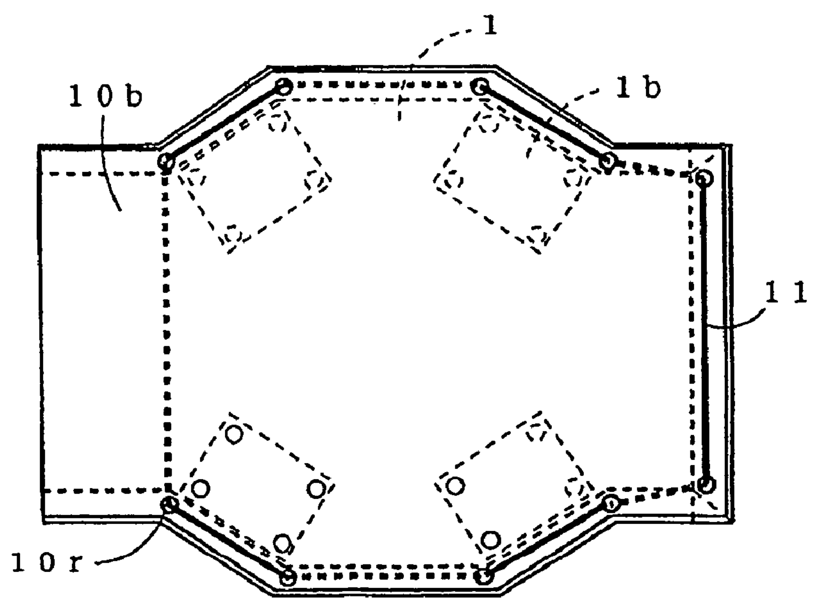
FIG. 2 is a bottom view of the magnetic field generator for MRI of the first embodiment of the present invention, which is covered by the covering member.

FIG. 2 is a bottom view of the magnetic field generator 100 for MRI, which is covered by the covering member.

A fastening member 11 fastens the covering member 10 to the generator main body 1 by closing the bottom of the covering member 10 with the bottom part 10*b*. The fastening member 11 is a string or a rope made of stainless steel, aluminum, copper, nylon, cotton, hemp, flax, rubber or plastics. The material of the fastening member 11 is not limited to the above material, and any material which can fasten the covering member 10 to the generator main body 1, and which has strength such that the magnetic object can be prevented from intruding into the magnetic field generator 100, can be adopted for the fastening member 11.

A numeral 10*r* denotes a through hole through which the fastening member 11 passes.

Figure 3:
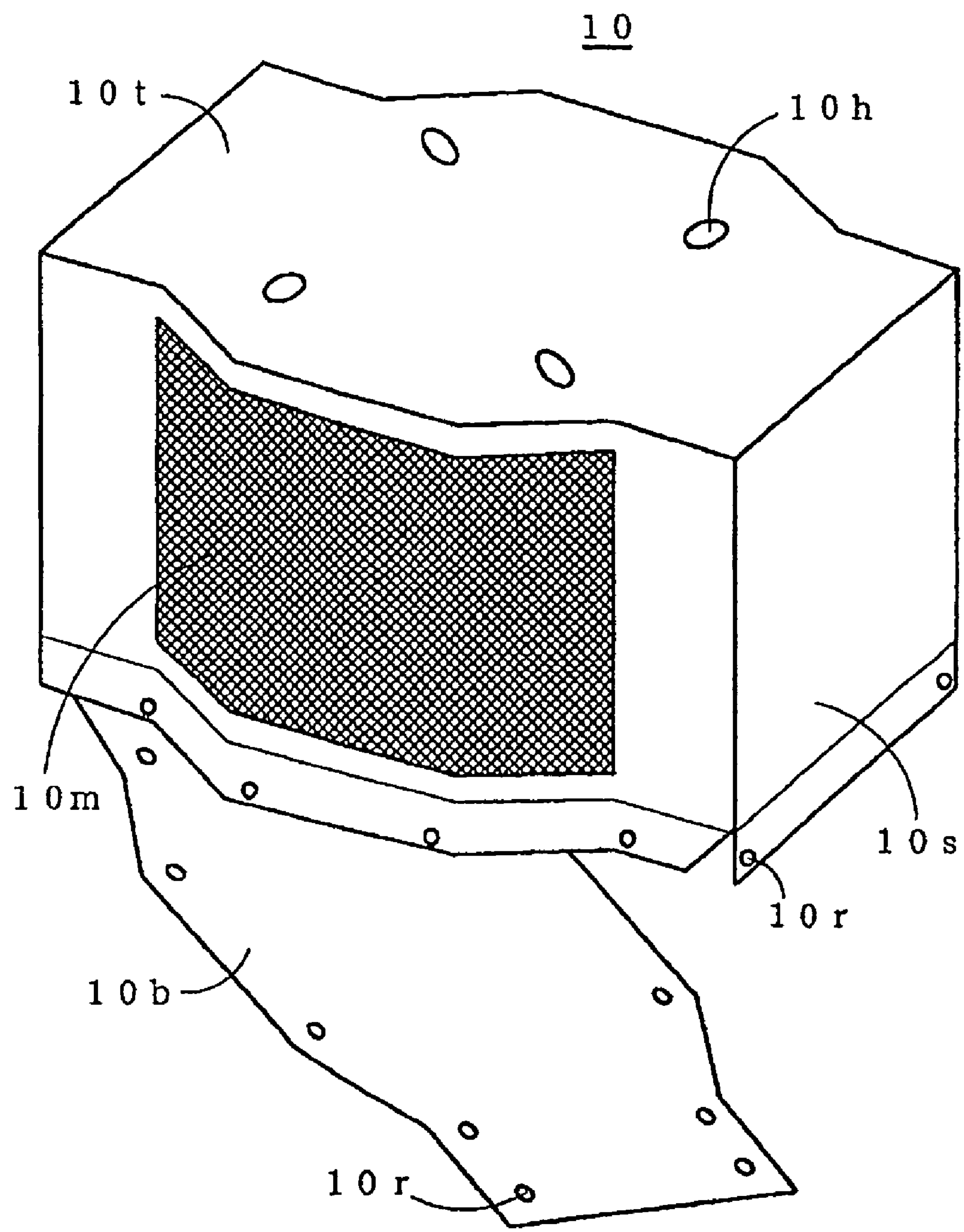
FIG. 3 is a perspective view of the covering member of the first embodiment of the present invention.

FIG. 3 is a perspective view of the covering member 10.

As shown in this figure, the bottom part 10*b* has a function as a lid to close the bottom of the covering member 10.

Although the covering member 10 in this figure looks like a self-supported structure, the covering member 10 may not be self-supported structure and may be formed so as to be flexible.

FIG. 4 is a perspective view of the generator main body 1.

In this figure, the generator main body 1 is shown without being covered by the covering member. The generator main body 1 includes a pair of plate yokes 1*d* opposed to each other with space in between, a magnet be disposed in each of opposed parts of the pair of plate yokes 1*d*, and a pair of column yokes if for magnetically connecting the plate yokes 1*d*.

As described, the magnetic field generator 100 for MRI of the first embodiment has a simple configuration, thus reduces the time and labors needed to pack or cover the magnetic field generator 100 for MRI for storage and transport thereof. Furthermore, since the covering member 10 wholly covers the generator main body 1, it is possible to securely prevent a magnetic object, such as rigs, wrench, jack and hammer, from intruding into the magnetic field generator even in case that the magnetic field generator 100 for MRI is lifted up or is transported to a destination thereof.

Second Embodiment

Figure 5:
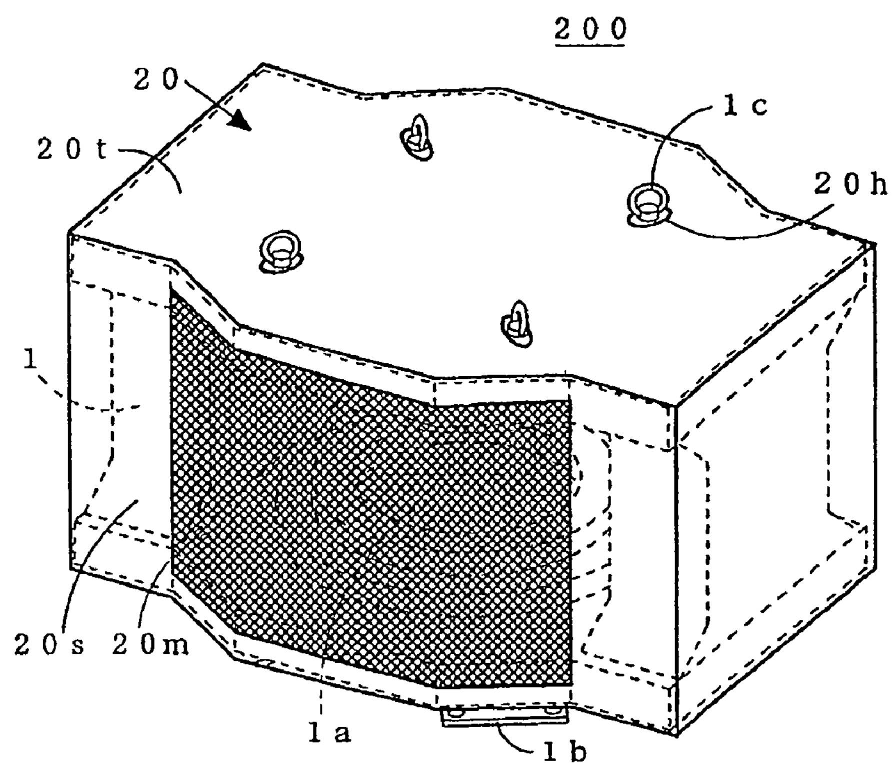
FIG. 5 is a perspective view of a magnetic field generator for MRI of a second embodiment of the present invention, which is covered by a covering member.

FIG. 5 is a perspective view of a magnetic field generator for MRI of a second embodiment of the present invention, which is covered by a covering member.

As shown in this figure, a magnetic field generator 200 for MRI includes a generator main body 1 and a covering member 20 for covering a top and a side of the generator main body 1. The covering member 20 may be a large bag having a top part 20*t* and a side part 20*s* with a mesh portion 20*m* and open bottom, and is formed so as to cover the generator main body 1 from above. The mesh portion 20*m* covers an opening portion 1*a* of the generator main body 1 for enabling one to look in through the mesh portion 20*m* in order to see the generator main body 1 inside of the covering member 20. The top part 20*t* and the side part 20*s* except the mesh portion 20*m* are made of a non-magnetic material, for example a closely woven fabric of stainless steel, aluminum, copper, nylon, cotton, hemp, flax, rubber or plastics. The mesh portion 20*m* is made of a non-magnetic material, for example a mesh or a net of stainless steel, aluminum, copper, nylon, cotton, hemp, flax, rubber or plastics. The materials of the top part 20*t* and the side part 20*s*, and the mesh portion 20*m* are not limited to the above materials, and any material can be adopted for them, which has strength such that a magnetic object, such as rigs, wrench, jack and hammer, can be prevented from intruding into the magnetic field generator 200 and an internal structure of the magnetic field generator 200 can be protected.

The top part 20*t* has four holes 20*h* for exposing four rings 1*c* of the generator main body 1, which are provided in the upper plate yoke. These rings 1*c* are used to lift up the magnetic field generator 200 for MR1. A numeral 1*b* denotes a leg of the generator main body 1.

Figure 6:
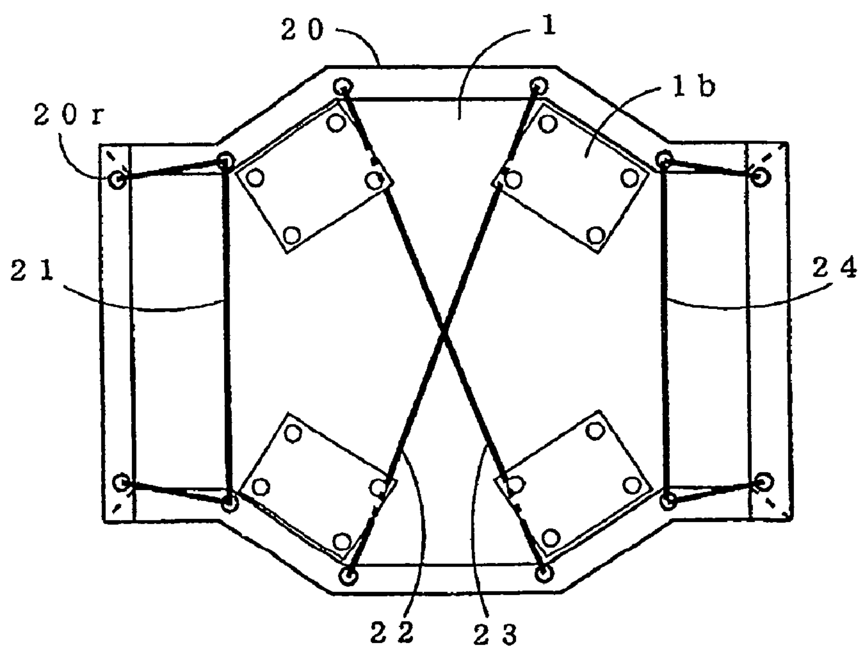
FIG. 6 is a bottom view of the magnetic field generator for MRI of the second embodiment of the present invention, which is covered by a covering member.

FIG. 6 is a bottom view of the magnetic field generator 200 for MRI, which is covered by a covering member.

Fastening members 21, 22, 23 and 24 fasten the covering member 20 to the generator main body 1 by tying in the bottom portion of the side part 20*s*. The fastening members 21, 22, 23 and 24 are a string or a rope made of stainless steel, aluminum, copper, nylon, cotton, hemp, flax, rubber or plastics. The material of the fastening members 21, 22, 23 and 24 is not limited to the above material, and any material which can fasten the covering member 20 to the generator main body 1, and which has strength such that the magnetic object can be prevented from intruding into the magnetic field generator 200, can be adopted for the fastening members 21, 22, 23 and 24.

A numeral 20*r* denotes a through hole through which each of the fastening members 21, 22, 23 and 24 passes.

Figure 7:
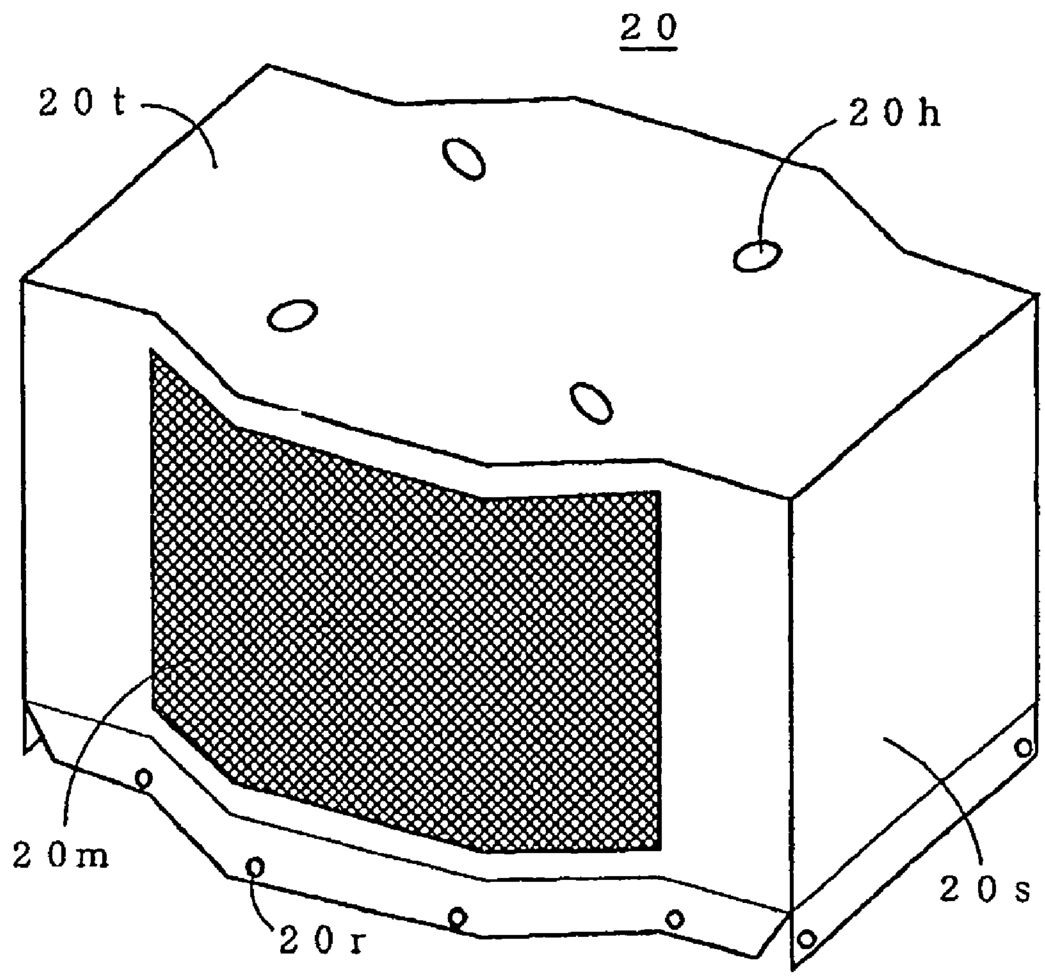
FIG. 7 is a perspective view of a covering member of the second embodiment of the present invention.

FIG. 7 is a perspective view of the covering member 20.

As shown in this figure, the covering member 20 has an open bottom. Although the covering member 20 in this figure looks like a self-supported structure, the covering member 20 may not be self-supported structure and may be formed so as to be flexible.

As described, the magnetic field generator 200 for MRI of the second embodiment has a simple configuration, thus reduces the time and labors needed to pack the magnetic field generator 200 for MRI for storage and transport thereof. Furthermore, since the covering member 20 does not cover the bottom of the generator main body 1, the configuration can be simple more. Additionally, the covering member 20 can be used even turning upside down.

Third Embodiment

Figure 8:
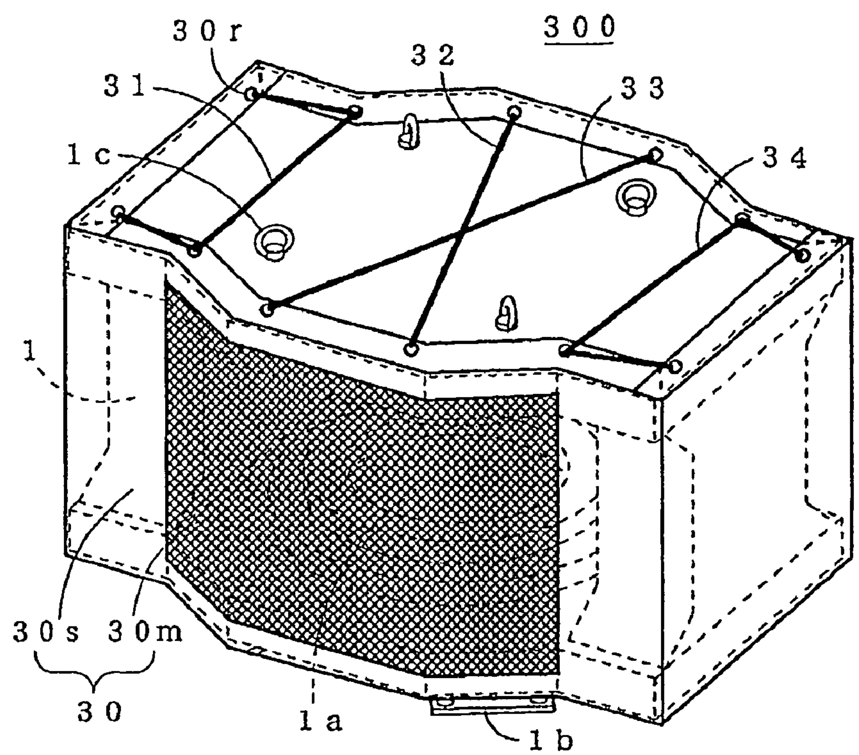
FIG. 8 is a perspective view of a magnetic field generator for MRI of a third embodiment of the present invention, which is covered by a covering member.

FIG. 8 is a perspective view of a magnetic field generator for MRI of a third embodiment of the present invention, which is covered by a covering member.

As shown in this figure, a magnetic field generator 300 for MRI includes a generator main body 1 and a covering member 30 for covering a side of the generator main body 1.

The covering member 30 may be a large pipe having a side part 30*s* with a mesh portion 30*m*, an open top, and an open bottom.

The mesh portion 30*m* covers an opening portion 1*a* of the generator main body 1 for enabling one to look in through the mesh portion 30*m* in order to see the generator main body 1 inside of the covering member 30. The side part 30*s* except the mesh portion 30*m* is made of a non-magnetic material, for example a closely woven fabric of stainless steel, aluminum, copper, nylon, cotton, hemp, flax, rubber or plastics. The mesh portion 30*m* is made of a non-magnetic material, for example a mesh or a net of stainless steel, aluminum, copper, nylon, cotton, hemp, flax, rubber or plastics. The materials of the side part 30*s* and the mesh portion 30*m* are not limited to the above materials, and any material can be adopted for them, which has strength such that a magnetic object, such as rigs, wrench, jack and hammer, can be prevented from intruding into the magnetic field generator 300 and an internal structure of the magnetic field generator 300 can be protected.

Four rings 1*c* of the generator main body 1 are provided in the upper plate yoke and are exposed at the open top. These rings 1*c* are used to lift up the magnetic field generator 300 for MM. A numeral 1*b* denotes a leg of the generator main body 1.

Fastening members 31, 32, 33 and 34 (and 21, 22, 23 and 24 as shown in FIG. 6) fasten the covering member 30 to the generator main body 1 by tying in the top portion (and the bottom portion as shown in FIG. 6) of the side part 30*s*. The fastening members 31, 32, 33 and 34 are a string or a rope made of stainless steel, aluminum, copper, nylon, cotton, hemp, flax, rubber or plastics. The material of the fastening members 31, 32, 33 and 34 is not limited to the above material, and any material which can fasten the covering member 30 to the generator main body 1, and which has strength such that the magnetic object can be prevented from intruding into the magnetic field generator 300, can be adopted for the fastening members 31, 32, 33 and 34.

A numeral 30*r* denotes a through hole through which the fastening members 31, 32, 33 and 34 (and 21, 22, 23 and 24 as shown in FIG. 6) pass.

Figure 9:
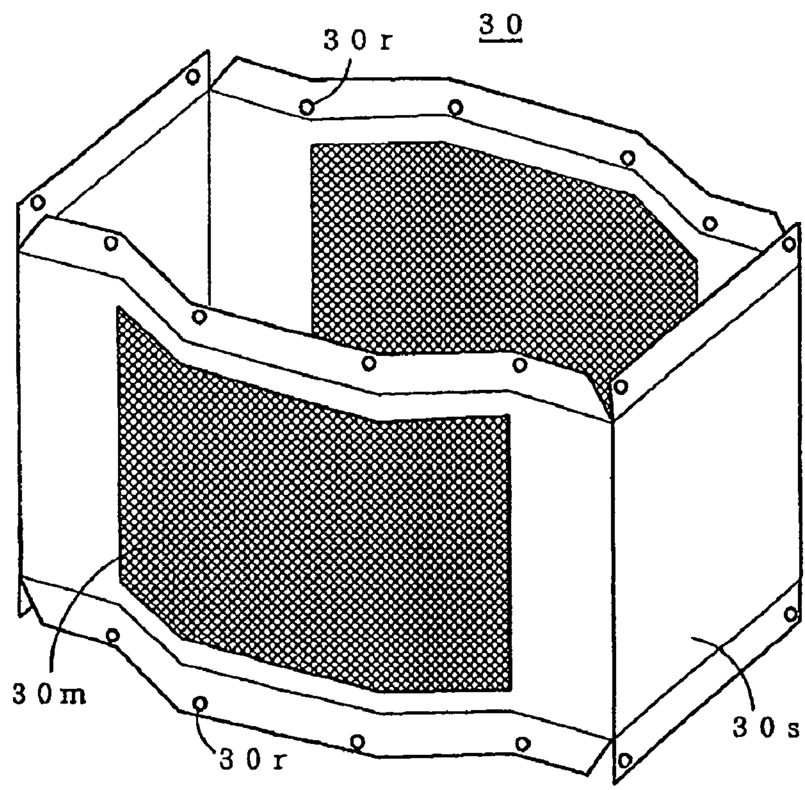
FIG. 9 is a perspective view of a covering member of the third embodiment of the present invention.

FIG. 9 is a perspective view of the covering member 30.

As shown in this figure, the covering member 30 has an open top and an open bottom. Although the covering member 30 in this figure looks like a self-supported structure, the covering member 30 may not be self-supported structure and may be formed so as to be flexible.

As described, the magnetic field generator 300 for MRI of the third embodiment has a simple configuration, thus reduces the time and labors needed to pack the magnetic field generator 300 for MRI for storage and transport thereof. Furthermore, since the covering member 30 does not cover the top and the bottom of the generator main body 1, the configuration can be simple more. Additionally, the covering member 30 can be used even turning upside down.

Fourth Embodiment

Figure 10:
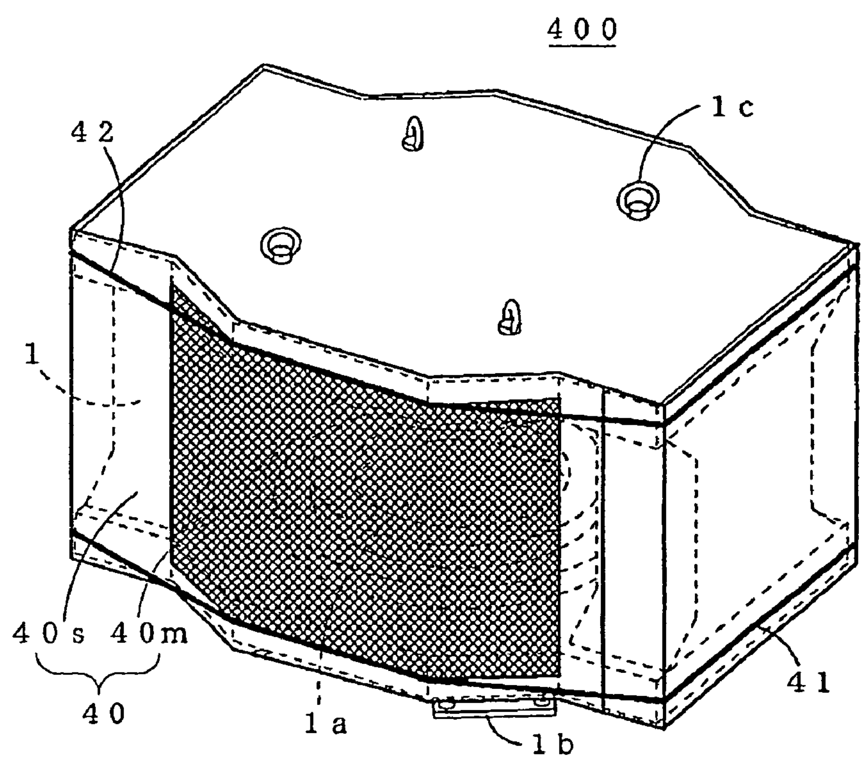
FIG. 10 is a perspective view of a magnetic field generator for MRI of a forth embodiment of the present invention, which is covered by a covering member.

FIG. 10 is a perspective view a magnetic field generator for MRI of a fourth embodiment of the present invention, which is covered by a covering member.

A magnetic field generator 400 for MRI includes a generator main body 1 and a covering member 40 for covering a side of the generator main body 1.

The covering member 40 may be a large belt having a non-mesh portion 40*s* and a mesh portion 40*m*. The mesh portion 40*m* covers an opening portion Ta of the generator main body 1 for enabling one to look in through the mesh portion 40*m* in order to see the generator main body 1 inside of the covering member 40. The non-mesh portion 40*s* is made of a non-magnetic material, for example a closely woven fabric of stainless steel, aluminum, copper, nylon, cotton, hemp, flax, rubber or plastics. The mesh portion 40*m* is made of a non-magnetic material, for example a mesh or a net of stainless steel, aluminum, copper, nylon, cotton, hemp, flax, rubber or plastics. The materials of the non-mesh portion 40*s* and the mesh portion 40*m* are not limited to the above materials, and any material can be adopted for them, which has strength such that a magnetic object, such as rigs, wrench, jack and hammer, can be prevented from intruding into the magnetic field generator 400 and an internal structure of the magnetic field generator 400 can be protected.

Four rings 1*c* of the generator main body 1 are provided in the upper plate yoke and are exposed at a top of the magnetic field generator 400•for MRI. These rings 1*c* are used to lift up the magnetic field generator for MRI 400. A numeral 1*b* denotes a leg of the generator main body 1.

Fastening members 41 and 42 fasten the covering member 40 to the generator main body 1 by passing around the covering member 40. The fastening members 41 and 42 are a string or a rope made of stainless steel, aluminum, copper, nylon, cotton, hemp, flax, rubber or plastics. The material of the fastening members 41 and 42 is not limited to the above material, and any material which can fasten the covering member 40 to the generator main body 1, and which has strength such that the magnetic object can be prevented from intruding into the magnetic field generator 400, can be adopted for the fastening members 41 and 42.

Figure 11:
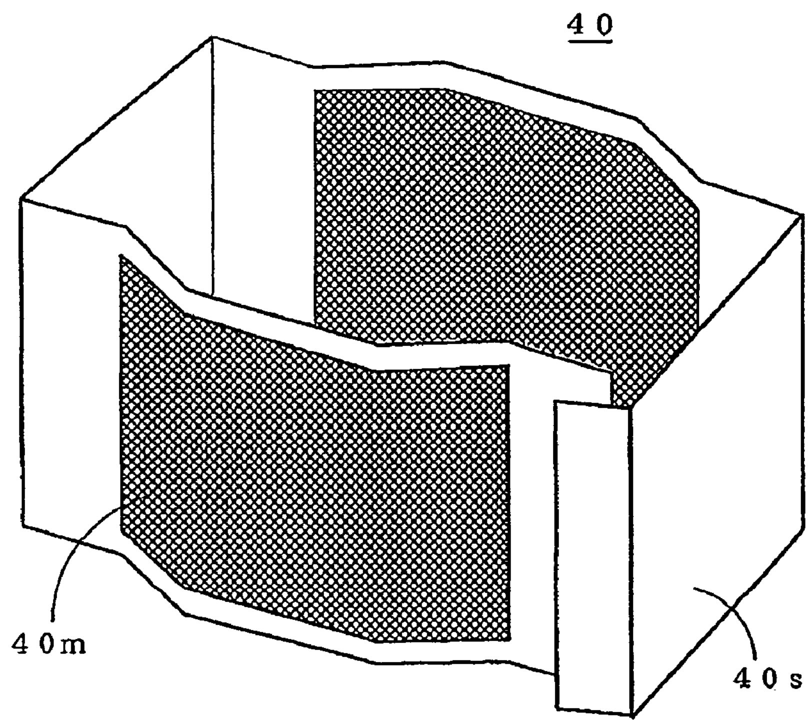
FIG. 11 is a perspective view of a covering member of the forth embodiment of the present invention.

FIG. 11 is a perspective view of the covering member 40.

As shown in this figure, the covering member 40 is winded around the side of the generator main body 1. Although the covering member 40 in this figure looks like a self-supported structure, the covering member 40 may not be self-supported structure and may be formed so as to be flexible.

As described, the magnetic field generator 400 for MRI of the fourth embodiment has a simple configuration, thus reduces the time and labors needed to pack the magnetic field generator 400 for MRI for storage and transport thereof. Furthermore, since the covering member 40 is a winding type, lifting up the generator main body 1 to attach the covering member 40 thereto is not required.

Fifth Embodiment

Figure 12:
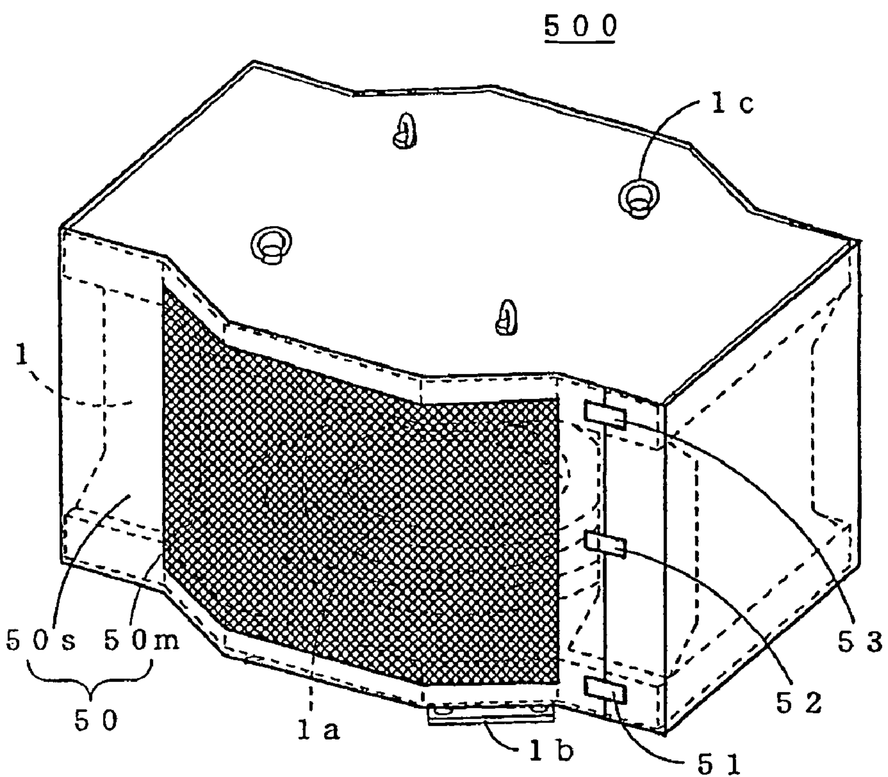
FIG. 12 is a perspective view of a magnetic field generator for MRI of a fifth embodiment of the present invention, which is covered by a covering member.

FIG. 12 is a perspective view of a magnetic field generator for MRI of a fifth embodiment of the present invention, which is covered by a covering member.

As shown in this figure, a magnetic field generator 500 for MRI includes a generator main body 1 and a covering member 50 for covering a side of the generator main body 1.

The covering member 50 may be a large belt having a non-mesh portion 50*s*, a mesh portion 50*m* and a plurality of fastening members 51, 52 and 53. The mesh portion 50*m* covers an opening portion 1*a* of the generator main body 1 for enabling one to look in through the mesh portion 50*m* in order to see the generator main body 1 inside of the covering member 50. The non-mesh portion 50*s* is made of a non-magnetic material, for example a closely woven fabric of stainless steel, aluminum, copper, nylon, cotton, hemp, flax, rubber or plastics. The mesh portion 50*m* is made of a non-magnetic material, for example a mesh or a net of stainless steel, aluminum, copper, nylon, cotton, hemp, flax, rubber or plastics. The materials of the non-mesh portion 50*s* and the mesh portion 50*m* are not limited to the above materials, and any material can be adopted for them, which has strength such that a magnetic object, such as rigs, wrench, jack and hammer, can be prevented from intruding into the magnetic field generator 500 and an internal structure of the magnetic field generator 300 can be protected.

The fastening members 51, 52 and 53 are a fastening tape or a buckle.

Four rings 1*c* of the generator main body 1 are provided in the upper plate yoke and are exposed at a top of the magnetic field generator 500 for MRI. These rings 1*c* are used to lift up the magnetic field generator 500 for MRI. A numeral 1*b* denotes a leg of the generator main body 1.

Figure 13:
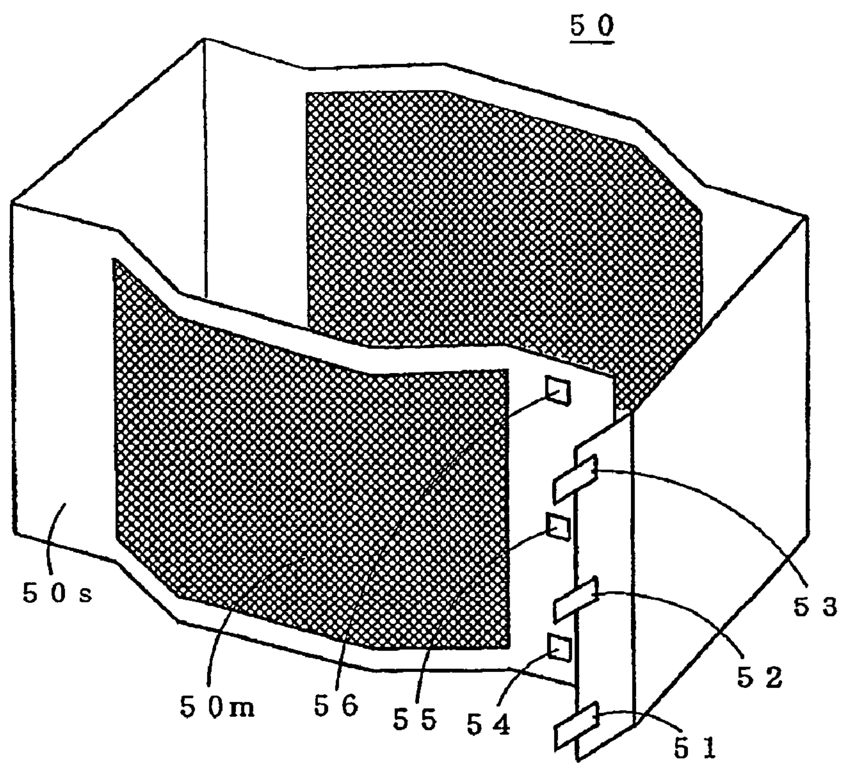
FIG. 13 is a perspective view of a covering member of the fifth embodiment of the present invention.

FIG. 13 is a perspective view of the covering member 50.

As shown in this figure, the covering member 50 is winded around the side of the generator main body 1 and the fastening members 51, 52 and 53 are fixed to counter fastening members 54, 55 and 56. A pair of the fastening members 51 and the counter fastening members 54, a pair of the fastening members 52 and the counter fastening members 55, and a pair of the fastening members 53 and the counter fastening members 56 may be formed of a usual or conventional velcro fastener or velcro strap, respectively. However, they are not limited to the usual or conventional velcro fastener or velcro strap, and may have any structure if it can fasten the covering member 50 to the generator main body 1, and has strength such that the magnetic object can be prevented from intruding into the magnetic field generator 500.

As described, the magnetic field generator 500 for MRI of the fifth embodiment has a simple configuration, thus reduces the time and labors needed to pack or cover the magnetic field generator 500 for MRI for storage and transport thereof. Furthermore, since the covering member 50 is a winding type, lifting up the generator main body 1 to attach the covering member 50 thereto is not required. Moreover, since the fastening members 51, 52 and 53 are provided integrally with the covering member 50, it is convenient for handling.

In the above-described embodiments, the mesh portion is provided in the covering member. With regard to the size of the mesh portion, the size is arbitrary if the mesh portion can cover a whole part or a part of the opening portion of the generator main body for enabling one to look in through the mesh portion in order to see the generator main body inside of the covering member.

Also, the covering member can be formed without the mesh portion or can be formed by the non-mesh portion only.

The present invention is not limited to the above-described embodiments, and any change, modification or substitution within the spirit of the present invention should be contained in the scope of the present invention.

The invention claimed is:

1. A magnetic field generator for MRI comprising:

a generator main body including a pair of plate yokes opposed to each other with space in between, a magnet disposed in each of opposed surfaces of said pair of plate yokes, and a column yoke for magnetically connecting said pair of plate yokes; and a member, made of a closely woven non-magnetic material, for covering the whole generator main body, at least a portion of said member covering an opening defined by said generator body.

2. A magnetic field generator for MRI comprising:

a generator main body including a pair of plate yokes opposed to each other with space in between, a magnet disposed in each of opposed surfaces of said pair of plate yokes, and a column yoke for magnetically connecting said pair of plate yokes; and a member, made of a closely woven non-magnetic material, for covering one of a top and a side of said generator main body, a side of said generator main body, and a bottom and a side of said generator main body, at least a portion of said member covering an opening defined by said generator main body.

3. The magnetic field generator according to claim 2, wherein said portion of said member is made of a mesh of one of a stainless steel, aluminum, copper, nylon, cotton, hemp, flax, rubber and plastic material.

4. The magnetic field generator according to claim 2, wherein at least said portion of said member includes a mesh of one of a stainless steel, aluminum, copper, nylon, cotton, hemp, flax, rubber and plastic material.

5. The magnetic field generator according to claim 2, wherein said member is made of a closely woven fabric of one of a stainless steel, aluminum, copper, nylon, cotton, hemp, flax, rubber and plastic material.

6. The magnetic field generator according to claim 5, wherein at least said portion of said member includes a mesh of one of a stainless steel, aluminum, copper, nylon, cotton, hemp, flax, rubber and plastic material.

7. The magnetic field generator according to claim 2, wherein at least said portion of said member includes a mesh of one of a stainless steel, aluminum, copper, nylon, cotton, hemp, flax, rubber and plastic material, and another portion of said member is made of a closely woven fabric of one of a stainless steel, aluminum, copper, nylon, cotton, hemp, flax, rubber and plastic material.

8. The magnetic field generator according to claim 2, further comprising a fastening member for fastening said member to said generator main body.

9. The magnetic field generator according to claim 8, wherein said fastening member includes one of a string and a rope made of one of a stainless steel, aluminum, copper, nylon, cotton, hemp, flax, rubber and plastic material.

10. The magnetic field generator according to claim 8, wherein said fastening member is provided on one side of said pair of plate yokes.

11. The magnetic field generator according to claim 8, wherein said fastening member is provided so as to pass around said member.

12. The magnetic field generator according to claim 8, wherein said fastening member is removable after said magnetic field generator is transported to a destination.

13. The magnetic field generator according to claim 2, wherein said covering member is removable after said magnetic field generator is transported to a destination.

14. A method of covering a magnetic field generator for MRI, having a generator main body including a pair of plate yokes opposed to each other with space in between, a magnet disposed in each of opposed surfaces of the pair of plate yokes, and a column yoke for magnetically connecting the pair of plate yokes, said method comprising:

covering the whole generator main body with a member made of a non-magnetic material, at least a first portion of the member covering an opening defined by the generator main body, and a second portion of the member made of a closely woven fabric; and fastening the member to the generator main body.

15. A method of covering a magnetic field generator for MRI, having a generator main body including a pair of plate yokes opposed to each other with space in between, a magnet disposed in each of opposed surfaces of the pair of plate yokes, and a column yoke for magnetically connecting the pair of plate yokes, said method comprising:

covering one of a top and a side of the generator main body, a side of the generator main body, and a bottom and a side of the generator main body with a member made of a non-magnetic material, at least a first portion of the member covering an opening defined by the generator main body, and a second portion of the member made of a closely woven fabric; and fastening the member to the generator main body.

16. The method according to claim 15, wherein at least the first portion of the second portion of the member includes a mesh of one of a stainless steel, aluminum, copper, nylon, cotton, hemp, flax, rubber and plastic material.

17. The method according to claim 15, wherein the member is made of a closely woven fabric of one of a stainless steel, aluminum, copper, nylon, cotton, hemp, flax, rubber and plastic material.

18. The method according to claim 15, wherein at least the first portion of the member includes a mesh of one of a stainless steel, aluminum, copper, nylon, cotton, hemp, flax, rubber and plastic material, and the second portion of the member is made of a closely woven fabric of one of a stainless steel, aluminum, copper, nylon, cotton, hemp, flax, rubber and plastic material.

19. The method according to claim 15, wherein said fastening step includes a step of fastening the member to the generator main body using one of a string and rope made of one of a stainless steel, aluminum, copper, nylon, cotton, hemp, flax, rubber and plastic material.

20. The method according to claim 19, wherein the member for covering the generator main body and one of the string and the rope are removable after the magnetic field generator is transported to a destination.

* * * * *

UNITED STATES PATENT AND TRADEMARK OFFICE

CERTIFICATE OF CORRECTION

PATENT NO. : 7,595,713 B2
APPLICATION NO. : 10/552359
DATED : September 29, 2009
INVENTOR(S) : Yu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 965 days.

Signed and Sealed this

Twenty-eighth Day of September, 2010

David J. Kappos

*Director of the United States Patent and Trademark Office*